United States Patent

Endo et al.

[11] Patent Number: 5,949,663
[45] Date of Patent: Sep. 7, 1999

[54] INVERTER APPARATUS CAPABLE OF READILY MODIFICATION OF THE SPECIFICATION AND PERFORMANCE THEREOF

[75] Inventors: Tsunehiro Endo, Narashino; Kinya Nakatsu, Hitachi; Hiroshi Fujii, Chiba; Norinaga Suzuki, Sawara; Masahiro Hiraga, Yachiyo, all of Japan

[73] Assignees: Hitachi, Ltd., Tokyo; Hitachi Keiyo Engineering Co., Ltd., Narashino, both of Japan

[21] Appl. No.: 09/099,391

[22] Filed: Jun. 18, 1998

[30] Foreign Application Priority Data

Jul. 15, 1997 [JP] Japan ................................. 9-189460

[51] Int. Cl.⁶ ................................................. H02M 5/458
[52] U.S. Cl. .................... 363/37; 363/40; 363/97
[58] Field of Search ................................. 363/35, 37, 39, 363/40, 41, 42, 95, 97, 98, 132

[56] References Cited

U.S. PATENT DOCUMENTS

| | | | |
|---|---|---|---|
| 5,053,939 | 10/1991 | Kirchberg, Jr. et al. | 363/41 |
| 5,155,671 | 10/1992 | Inaba et al. | 363/37 |
| 5,268,832 | 12/1993 | Kandatsu | 363/95 |
| 5,371,666 | 12/1994 | Miller | 363/98 |
| 5,416,686 | 5/1995 | Azuma et al. | 363/37 |
| 5,793,623 | 8/1998 | Kawashima et al. | 363/56 |

FOREIGN PATENT DOCUMENTS

| | | |
|---|---|---|
| 1291693 | 5/1988 | Japan . |
| 265674 | 8/1988 | Japan . |
| 2211039 | 2/1989 | Japan . |

*Primary Examiner*—Adolf Deneke Berhane
*Attorney, Agent, or Firm*—Antonelli, Terry, Stout & Kraus, LLP

[57] ABSTRACT

Objects of the present invention are to provide an inverter apparatus in which the specification thereof can be readily changed without changing an inverter basic unit, and to provide an inverter apparatus in which an inverter basic unit and an I/O block unit can be readily separated and the number of degrees of freedom of installation can be increased. An inverter apparatus of the present invention is constituted by an inverter basic unit and an I/O block unit which is connected to the inverter basic unit separately therefrom. The inverter basic unit is constituted by a power module which includes a DC/AC converter and a controller including a microcomputer for managing the DC/AC converter. The I/O block unit is constructed in the form of an I/O block unit which includes an input/output interface unit having signal connection terminals. Since the plurality kinds of I/O block units can be connected to the inverter basic unit and also the software of the microcomputer can be changed with the microcomputer mounted on the associated substrate, the specification and the performance of the inverter apparatus can be readily changed.

20 Claims, 9 Drawing Sheets

PRIOR ART

INVERTER APPARATUS CAPABLE OF READILY MODIFICATION OF THE SPECIFICATION AND PERFORMANCE THEREOF

BACKGROUND OF THE INVENTION

The present invention relates in general to an inverter apparatus which is capable of running an AC electric motor at an adjustable speed, and further readily modification of the specification and performance thereof.

An inverter apparatus which is capable of running an induction motor at an adjustable speed is utilized in various kinds of applications, and various kinds of inverter apparatus having various performances and functions are utilized depending on the applications. Now, a conventional inverter apparatus will be described by taking a general purpose inverter apparatus as an example.

Figure 11:
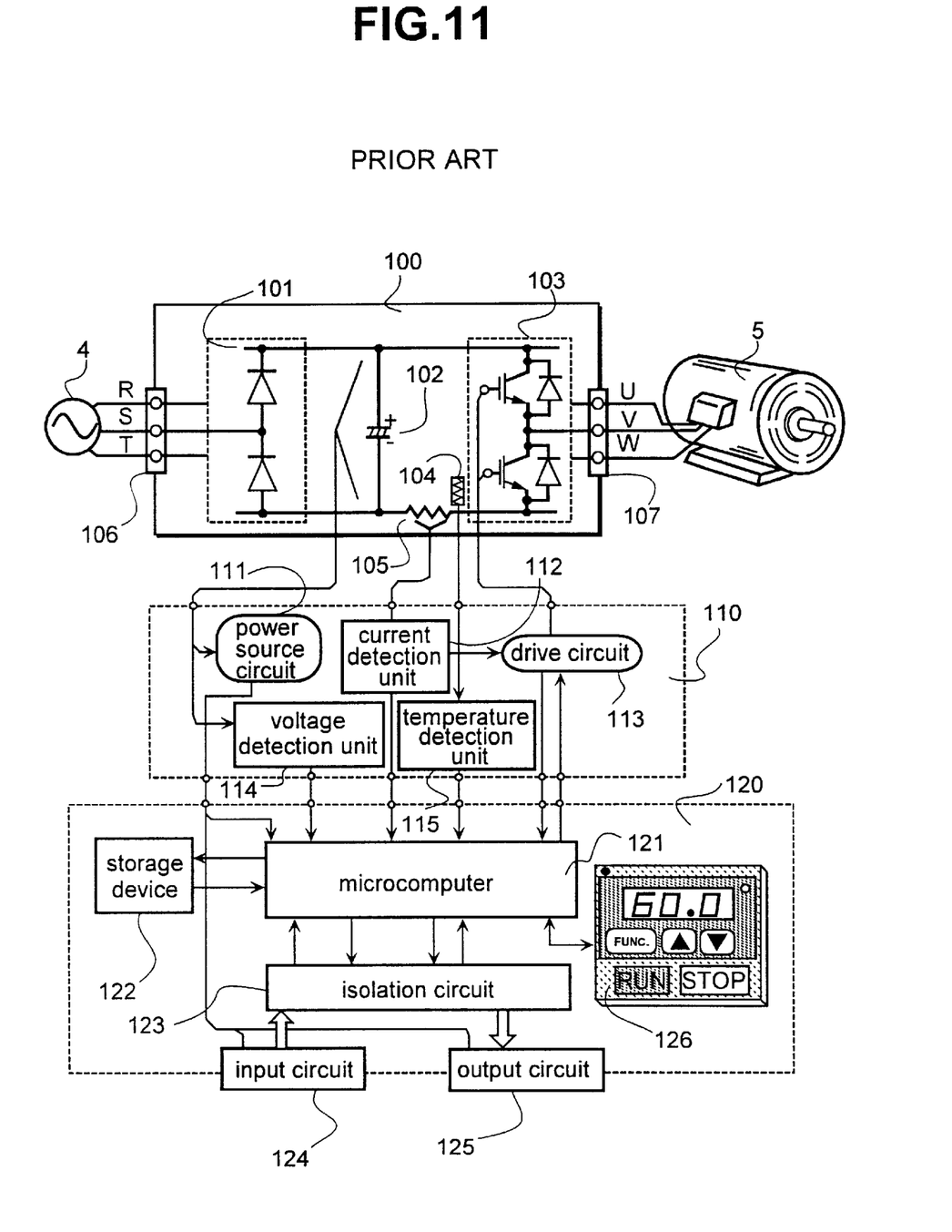
FIG. 11 is a block diagram, partly in circuit diagram, showing a configuration of a conventional inverter circuit.

This general purpose inverter apparatus has a configuration as shown in FIG. 11. An induction motor 5 is driven by an AC power source 4 through a main circuit unit 100. The main circuit unit 100 includes: a converter 101 (while in actual, it is configured by three-phase bridge connection of diodes, it is schematically depicted in the figure for the sake of simplicity); a smoothing capacitor 102; an inverter 103 as a DC/AC converter (while in actual, it is configured by three-phase bridge connection of switching diodes (power transistors or the like), it is schematically depicted in the figure for the sake of simplicity); a thermistor 104; a resistor 105 for detecting a current; and the like. In addition, a power source sensor unit 110 includes: a power source circuit 111 for producing various kinds of DC voltages; detection units such as a current detection unit 112 for detecting a current of the main circuit unit, a voltage detection unit 114 for detecting a voltage thereof, and a temperature detection unit 115 for detecting a temperature thereof; a drive circuit 113 for supplying a drive signal to the inverter 103; and the like.

A control•input/output unit 120 includes: a microcomputer 121 as a main portion; a storage device 122; an operator 126, and an input circuit 124 and output circuit 125 having respective connection terminals which elements constitute an input/output interface; and the like. A user operates the inverter apparatus using the operator 126, and connects wires to the signal connection terminals of the input circuit 124 and the output circuit 125, respectively, thereby controlling the inverter apparatus from the external controller.

The above-mentioned microcomputer 121 manages the running of the inverter 103 in accordance with the signals outputted from the input circuit 124 and the operator 126 under the program control thereof. For example, this management by the microcomputer 121 relates to the determination of the frequency and the voltage, the production of the drive signal, and the like, and in addition thereto, the selection of the running method is included therein. Further, the microcomputer 121 carries out the protection operation in accordance with the signals outputted from the various kinds of detection circuits. On the other hand, in the case where the frequency, the rotational direction or the current is determined and also the protection operation is carried out, the data relating to the protection factors thereof and the like is outputted to the operator 126 to be displayed thereon.

In this connection, there is an inverter apparatus which is of a type in which the above-mentioned operator 126 is mounted on the associated substrate or only the operator 126 is separated from other units so as to be able to be installed in the different position.

On the other hand, as an example of the inverter apparatus which is devided into two blocks, there is known one disclosed in JP-A-2-211039. This type of inverter apparatus is such that the servo motor is an object, i.e., the power devices, and the base driver and the current detection unit as the peripheral circuits thereof are incorporated in the form of one pack of module in the motor body, and the control unit is provided on the controller side, and also the interface between the motor side and the controller side are carried out by utilizing the optical communication.

As described above, in the conventional general purpose inverter apparatus, the microcomputer 121 carries out both the management of the input/output interface and the management of the main circuit unit 100 on the inverter 103 side. In this connection, the management of the main circuit unit is inherent in the converter apparatus and hence does not depend on the functions required by a customer. On the other hand, the contents of the management of the input/output interface vary depending on the requests issued from a customer. For this reason, if the standard functions and performance which are prepared on the maker side do not fulfill the requests issued from a certain customer, then the software of the microcomputer 121 needs to be changed and the change of the operator 126, the input circuit 124 and the output circuit 125 will also be necessary as the case may be.

As a result, there arises a problem that the software of the microcomputer and the hardware of the input/output interface needs to be reproduced depending on the contents of the customer's requests. When changing the software of the microcomputer 121, if the program is stored in the internal memory (ROM) of the microcomputer 121, in particular, the exchange of the microcomputer 121 itself needs to be carried out.

In addition, the input circuit 124 and the output circuit 125 are conventionally fixedly mounted to the inverter apparatus and hence can not be separated from other constituent elements. For this reason, the main circuit unit 100, and the input circuit 124 and the output circuit 125 must be installed in the same place.

On the other hand, in the above-mentioned example of the separative construction of the servo motor, the technique of separating the control unit, i.e., the inside of the controller into the power unit and the peripheral circuits thereof is merely disclosed. More specifically, while the control unit side thereof is made a new controller, including the optical interface with the power unit and the peripheral circuits thereof, the above-mentioned example does not refer to the input/output of the data between the external device and the controller at all. JP-A-2-65674 and JP-A-1-291693 show an inverter apparatus not capable of modification of the specification and performance thereof.

SUMMARY OF THE INVENTION

In the light of the foregoing, the present invention was made in order to solve the problems associated with the conventional inverter apparatus, and it is therefore an object of the invention to provide an inverter apparatus in which the management of an input/output interface and the management of a main circuit unit on the inverter side are separated from each other. Therefore, the inverter apparatus is constituted by two or more separable blocks. That is, one block is constructed in the form of an inverter basic unit in which a part of a DC/AC converter and a part of a controller including a microcomputer for carrying out the management of the DC/AC converter are constructed in the form of a power module, while the other block is constructed in the form of an I/O block unit including an input/output interface unit having signal connection terminals. In addition, the above-mentioned power module is designed in such a way that different I/O block units can be connected thereto, and also the performance and the functions of the inverter apparatus can be changed in accordance with a specific type of I/O block units connected thereto.

Giving the description so as to correspond to an embodiment, the inverter basis unit is constructed by three kinds of substrates. More specifically, the inverter basic unit is constructed by the combination of a first substrate on which an inverter main circuit unit is mounted, a second substrate on which a controller including a microcomputer and a communication circuit with the above-mentioned I/O block unit is mounted, and a third substrate on which at least one capacitor for smoothing a DC voltage of the inverter basic unit is mounted. In addition, the software of the microcomputer is designed in such a way as to be updated via appropriate data downloaded from the outside of the power module. In addition, the power semiconductor devices constituting the DC/AC converter, and the controller including the microcomputer are constructed in the form of the power module in which these elements are mounted one a single package, and an end connection through which the controller and the input/output interface unit are connected to each other through the bidirectional communication is provided in the power module.

In the present invention, since the inverter apparatus is configured as described above, the inverter basic unit is made common to all the associated units and also only the I/O block unit is changed, thereby enabling the customer requested specification to be realized.

BRIEF DESCRIPTION OF THE DRAWINGS

The above and other objects as well as advantages of the invention will become clear by the following description of the preferred embodiments of the present invention with reference to the accompanying drawings, wherein.

DESCRIPTION OF THE PREFERRED EMBODIMENTS

One Embodiment of the Present Invention

One embodiment of the present invention will hereinafter be described in detail with reference to FIGS. 1 to 7.

General Configuration

Figure 1:
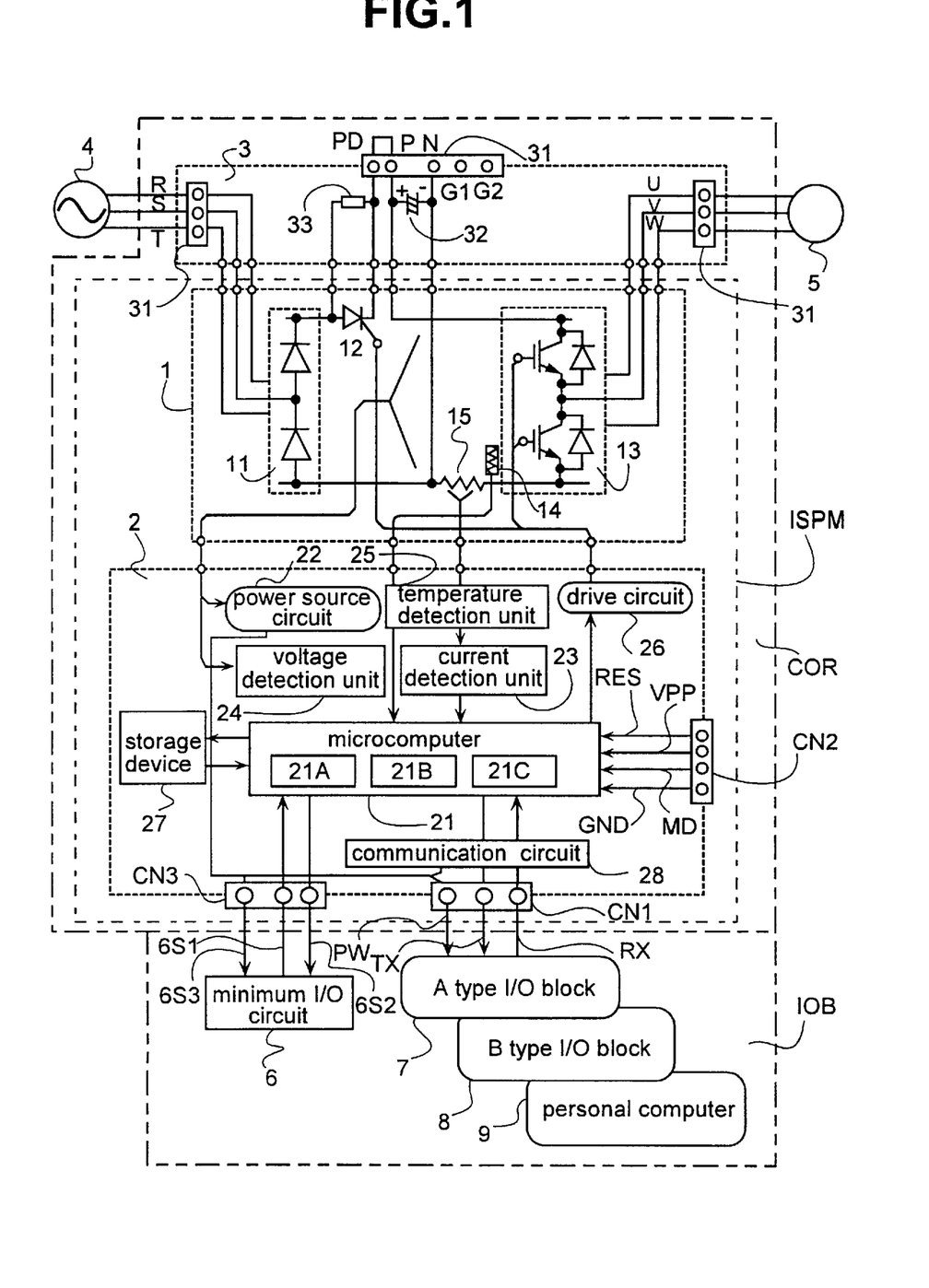
FIG. 1 is a block diagram, partly in circuit diagram, showing a configuration of an inverter apparatus according to an embodiment of the present invention.

FIG. 1 is a block diagram, partly in circuit diagram, showing a general configuration of an inverter apparatus according to one embodiment of the present invention. In general terms, the inverter apparatus is roughly constituted by an inverter basic unit COR and an I/O block unit IOB.

The inverter basic unit COR consists of a first substrate 1, a second substrate 2 and a third substrate 3. In this connection, both the first substrate 1 and the second substrate 2 constitute a power module ISPM. The I/O block unit IOB is connected to the second substrate 2 included in the power module ISPM.

In FIG. 1, as the I/O block unit IOB, there are shown a minimum I/O circuit 6 through which data is parallel-transmitted every kind of signal, an A type of I/O block 7, a B type of I/O block 8, and a personal computer 9 each as an I/O block unit through which the serial communication is carried out.

Outline of Each of Units

A terminal stage 31, a rush current suppressing resistor 33 for suppressing a rush current which is caused to flow therethrough at the time when turning on the power source, and a smoothing capacitor 32 are mounted on the above-mentioned third substrate 3. These components are connected to the first substrate 1 side. The terminal stage 31 includes power source connection terminals R, S and T, induction motor connection terminals U, V and W, terminals PD, P and N to which an external reactor is connected or a DC power source is connected, and two terminals G1 and G2 to which an earth cable is connected. In the figure, both the terminals P and PD are connected to each other.

The first substrate 1 includes: a converter 11 for converting an AC voltage which has been outputted from the AC power source 4 into a DC voltage (while in actual, it is configured by three-phase bridge connection of diodes and the like, it is schematically depicted in the figure for the sake of simplicity. When the power regeneration function is required, the devices each of which is capable of carrying out the ON/OFF control are used); a thyrister 12 for short-circuiting the above-mentioned rush current suppressing resistor 33; an inverter 13 as a DC/AC converter (while in actual, it is configured by three-phase bridge connection of switching devices (power transistors or the like), it is schematically depicted in the figure for the sake of simplicity. It constitutes electric power converting means for converting DC electric power into three-phase AC electric power); a thermistor 14; and a resistor 15 for detecting a current.

On the second substrate 2, there are mounted circuits corresponding to the power source•sensor unit 110 and the control•input/output unit 120 which are already described in the prior art with reference to FIG. 11. That is, as for the elements corresponding to the power source sensor unit 110, there are mounted thereon a power source circuit 22 for producing various kinds of DC voltages, a current detection unit 23, a voltage detection unit 24 and a temperature detection unit 25, and a drive circuit 26 for supplying a driving signal to both the inverter 13 and the thyristor 12, the units 23, 24 and 25, and the circuit 26 constituting the main circuits. On the other hand, as for the elements corresponding to the control•input/output unit 120, there are mounted thereon a microcomputer 21 for a core, a storage device 27 and a communication circuit 28. In addition, on the second substrate 2, connectors CN1, CN2 and CN3 are mounted.

The communication circuit 28 is connected to the connector CN1 through which a transmission signal TX and a reception signal RX are transmitted between the A type of I/O block 7, the B type of I/O block 8 or the personal computer 9 as the above-mentioned various kinds of I/O block units and the communication circuit 28. In addition, the power source voltage PW is supplied from the power source circuit 22 to those I/O block units through the connector CN1.

The minimum I/O circuit 6 is also a kind of I/O block units if it is taken in the broad sense. In this connection, the signals are transmitted between the minimum I/O circuit 6 and the microcomputer 21 for a core without via the communication circuit 28 through the connector CN3. One of these signals is an input signal 6S1 and the other signal is an output signal 6S2. In addition, likewise, the power source voltage 6S3 is supplied from the power source circuit 22 to the minimum I/O circuit 6.

In terms of the hardware, the microcomputer 21 for a core includes a flash memory 21A which is provided in the form of a ROM for storing therein the program, a RAM 21B, a timer 21C and the like. In this connection, with respect to the flash memory 21A, the writing mode thereof is selected on the basis of the power source voltage (established between VPP and GND) and signals RES and MD which are supplied through the connector CN2, and the program data thereof is serially transferred from the personal computer 9 for example thereto through both the connector CN1 and the communication circuit 28 in order to carry out the writing operation, i.e., the so-called down loading operation.

Structure of Inverter Basic Unit

Figure 2:
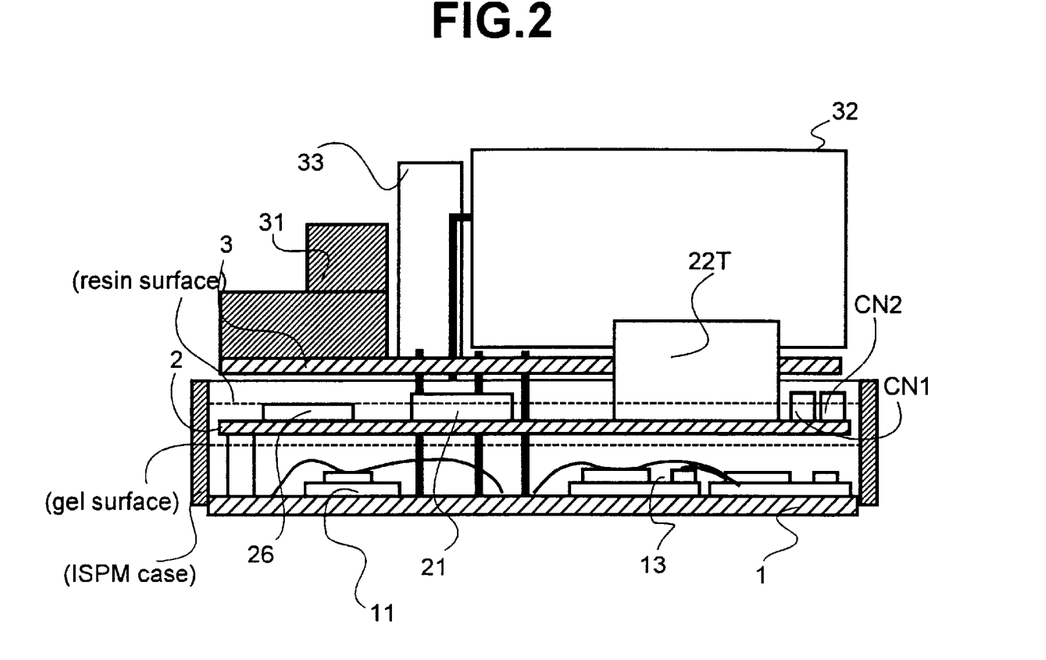
FIG. 2 is a vertical cross sectional view showing a structure of a main portion of the inverter apparatus shown in FIG. 1.
Figure 3:
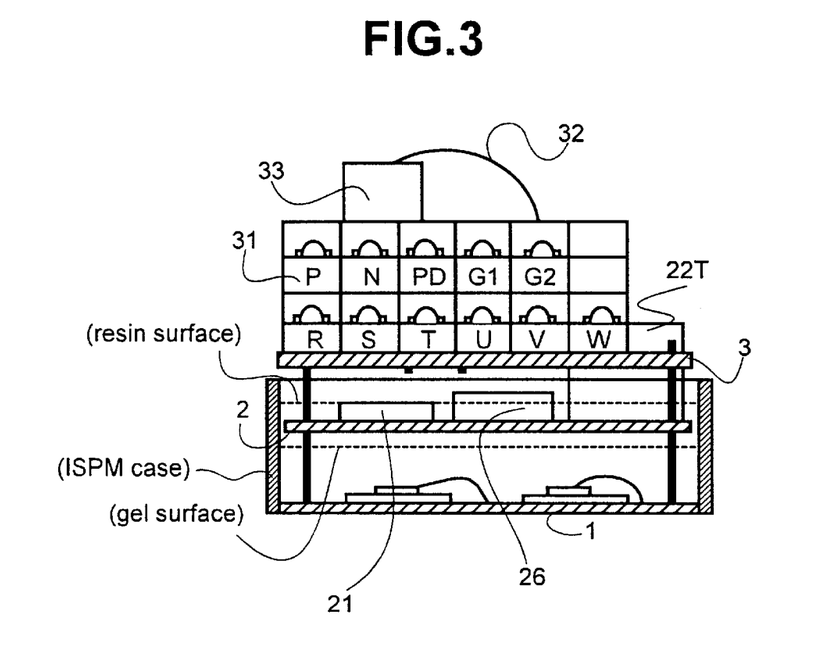
FIG. 3 is a transverse cross sectional view showing a structure of the main portion of the inverter apparatus shown in FIG. 1.

FIG. 2 and FIG. 3 are respectively a vertical cross sectional view and a transverse cross sectional view showing schematically the vertical cross sectional structure and the transverse cross sectional structure of the inverter basic unit COR.

The diodes and the power semiconductor devices (IGBTs in the example shown in FIG. 1) constituting the converter 11 and the inverter 13 are mounted in the form of the bare chip on the first substrate 1 and then gel is filled in the associated space defined between the first and second substrates 1 and 2 in order to protect the semiconductor surfaces. In addition, the fins (not shown) are attached to the surface opposite to the mounting surface of the first substrate 1 so that the heat which is generated by the internal semiconductor devices is dissipated therefrom.

The second substrate 2 is arranged above the first substrate 1. As has already been described above, on the second substrate 2 thus arranged, typically, there are mounted the microcomputer 21 for a core, the drive circuit 24 and a transformer 22T constituting the power source circuit 22, and in addition thereto, the connectors CN1 and CN2, and the like. The upper surface of the second substrate 2 is coated with resin for protection and insulation therefor. In this connection, the first substrate 1 is accommodated together with the second substrate 2 arranged thereabove in a case where the first substrate 1 and the second substrate constitute the power module ISPM.

In addition, the third substrate 3 is arranged above the second substrate 3. On the third substrate 3, there are mounted the terminal stage 31, the rush current suppressing resistor 33, the smoothing capacitor 32 and the like.

Processing Contents of Microcomputer for Core

Since the program of the microcomputer 21 for a core is stored in the flash memory 21A, the change of the program can be freely carried out from the outside with the microcomputer 21 for a core mounted on the second substrate 2 as described above. In this case, the description will hereinbelow be given as follows with respect to one embodiment of the contents of the program thereof with reference to FIG. 4.

Figure 4:
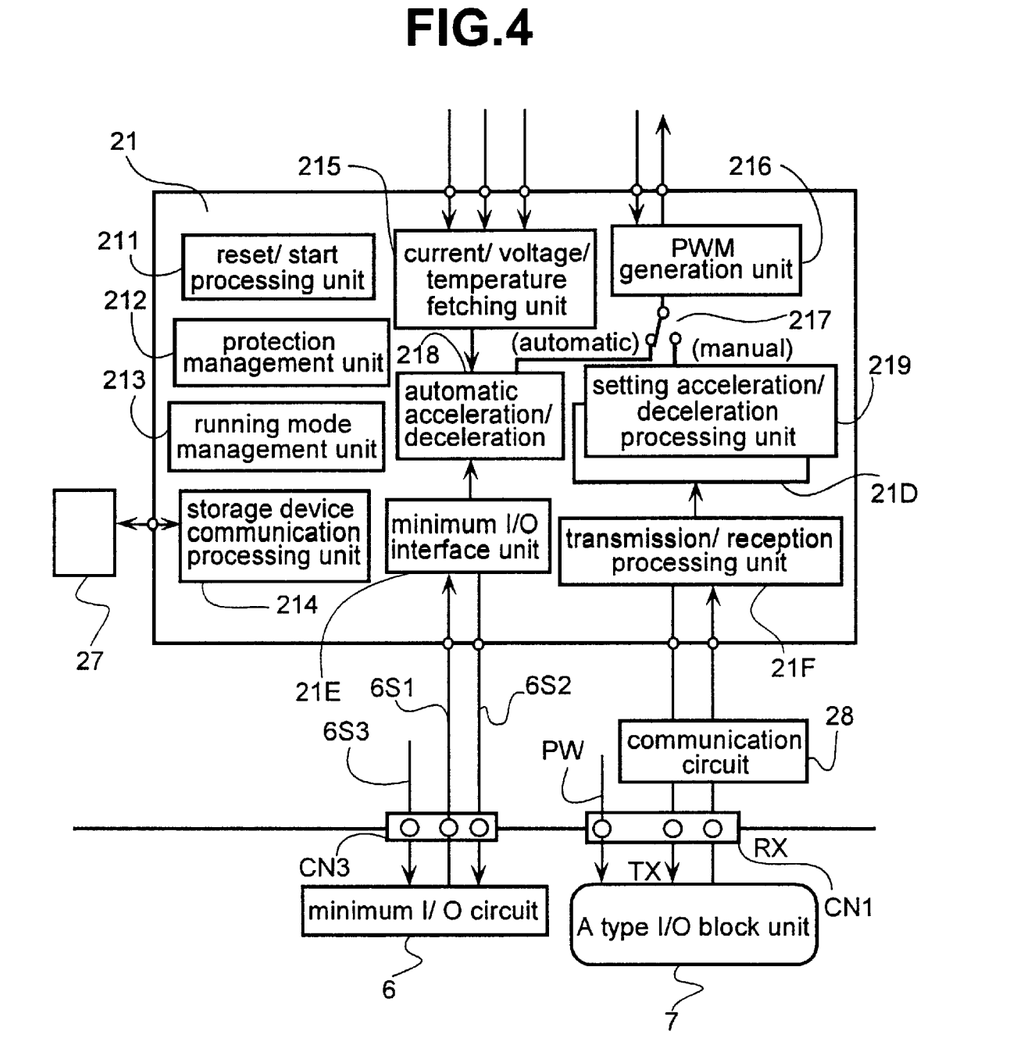
FIG. 4 is a control block diagram showing the processing contents of a microcomputer shown in FIG. 1.

The microcomputer 21 for a core includes, but is not limited to: a reset/restart processing unit 211 which is operated at the time when turning on the power source circuit 22 or when restarting the program; a protection management processing unit 212 which is operated at the time when the over-current or the over-voltage is generated; a running mode management unit 213 for managing the running mode of the inverter 13; a storage device communication processing unit 214 for communicating with the storage device 27; a current/voltage/temperature fetching unit 215 for reading out the data relating to a current, the data relating to a voltage and the data relating to a temperature from the current detection unit 23, the voltage detection unit 24 and the temperature detection unit 25, respectively; and a PWM generating unit 216 for producing a signal which is used to drive the power semiconductor devices constituting the inverter 13.

In addition, as the units for increasing step by step the output frequency and the output voltage of the inverter 13 to accelerate the rotational speed of the induction motor 5 and for decreasing step by step both the output frequency and the output voltage thereof to decelerate the rotational speed of the induction motor 5, the microcomputer 21 for a core includes, but is not limited to: an automatic acceleration/deceleration processing unit 218; the setting acceleration/deceleration processing unit 219; and an overload limiting unit 21D, and in addition thereto, a switch 217 which is provided in terms of the software for switching these units suitably. In this connection, the automatic acceleration/deceleration processing unit 218 executes the processing of determining automatically the acceleration time or the deceleration time so as for the over-current and the over-voltage not to be generated in acceleration or deceleration. On the other hand, the setting acceleration/deceleration processing unit 219 executes the processing of accelerating or decelerating the rotational speed of the induction motor 5 in accordance with the acceleration time or the deceleration time, which is previously set by a user, using the I/O block unit (e.g., the A type of I/O block unit 7), and the overload limiting unit 21A executes the processing of decelerating the rotational speed of the induction motor 5 in such a way that the current becomes equal to or lower than a predetermined current value.

In addition, the microcomputer 21 for a core includes a minimum I/O interface unit 21E for managing input/output of the data to/from the minimum I/O circuit 6, and a transmission/reception processing unit 21F for executing the processing of inputting/outputting the data to/from the various kinds of I/O block units (the A type of I/O block unit 7 in FIG. 4) through the communication circuit 28. In this case, it is assumed that for the transmission/reception processing, a transmission/reception circuit is utilized which is self-contained in the microcomputer 21 for a core.

Minimum I/O Circuit

Figure 5:
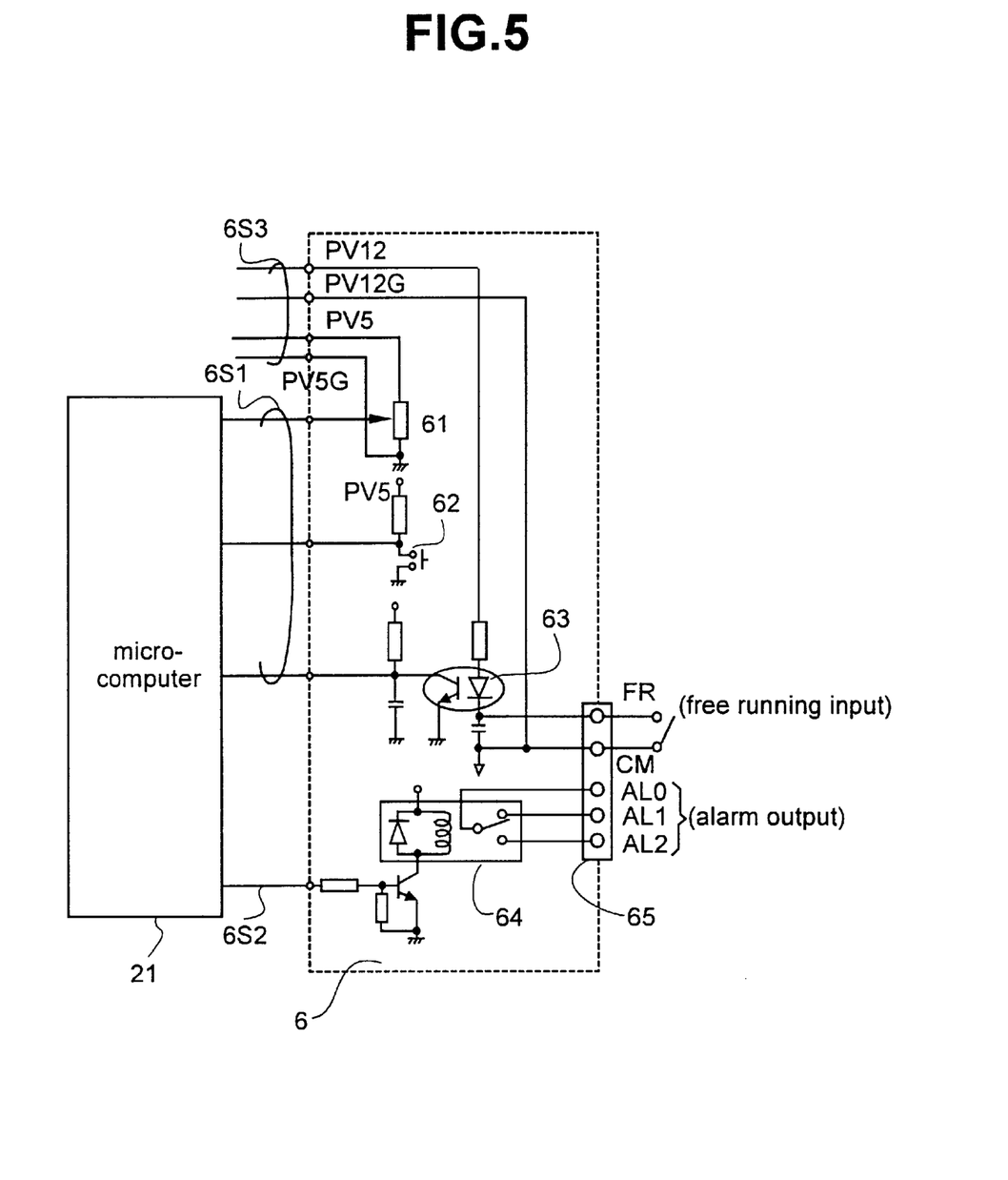
FIG. 5 is a circuit diagram, partly in block diagram, showing a detailed configuration of a main portion (minimum I/O circuit) shown in FIG. 1.

FIG. 5 shows a configuration of the minimum I/O circuit 6. This minimum I/O circuit 6 is a kind of I/O blocks which is of a type in which the input/output signal is directly transmitted/received to/from the microcomputer 21 for a core without through the communication circuit 28. The input signals 6S1 consist of the following three kinds of signals: the frequency command which is issued from a volume 61; a running stop reset signal which is outputted through a button switch 62; and a free running signal from the connection information which is provided between the terminals FR and CM provided on the terminal stage 65 to be inputted thereto through a photo-coupler 63 (the free running signal is run at the time when the switch between the terminals FR and CM has been turned on, and it is stopped at the time when the switch between the terminals FR and CM has been turned off). In addition, the two kinds of power source voltages (PV12–PV12G (DC12V) and PV5–PV5G (DC5V)) 6S3 are supplied to the minimum I/O circuit 6.

On the other hand, the output signal 6S2 is transmitted in the form of an alarm output signal to the outside of the inverter apparatus through an IC relay 64 and terminals AL0, AL1 and AL2 provided on the terminal stage 65 at the time when the operation of the inverter 13 has been stopped due to occurrence of the over-current or the over-voltage.

Then, the inverter apparatus of the present invention is designed in such a way that if the minimum I/O circuit 6 is connected to the terminal CN3 (more specifically, if any of the I/O block units such as the block units 7, 8 and 9 is not connected so that the communication between any of the I/O block units and the microcomputer 21 for a core is not carried out), then the automatic acceleration/deceleration processing of the two acceleration/deceleration processings within the microcomputer 21 for a core will be executed by the acceleration/deceleration processing unit 218.

In the case where the terminals FR and CM are not connected to each other, a user who intends to use the minimum I/O circuit 6 operates the inverter apparatus by pressing down the one press-down type of button switch 62, while adjusts the frequency thereof by adjusting the volume 61. In addition, by pressing down the button switch 62 in the running of the inverter apparatus, the running thereof can be stopped after the inverter apparatus has been automatically decelerated near 0 Hz. In the running, the stop and the change of the frequency command, the acceleration and deceleration can be automatically carried out by the automatic acceleration/deceleration processing unit 218.

On the other hand, the running and the stop of the inverter apparatus may also be carried out using both the terminals FR and CM. That is, if the two terminals FR and CM are connected to each other, then the inverter apparatus will be run at a frequency which has been set by adjusting the volume 61. On the other hand, if the two terminals are disconnected from each other, then, the inverter apparatus will be instantly stopped with the running thereof without undergoing the deceleration of the induction motor 5.

In addition, when the alarm output signal has been generated, the button switch 62 is pressed down to reset the alarm so that the inverter apparatus can be run again.

I/O Block Unit

Figure 6:
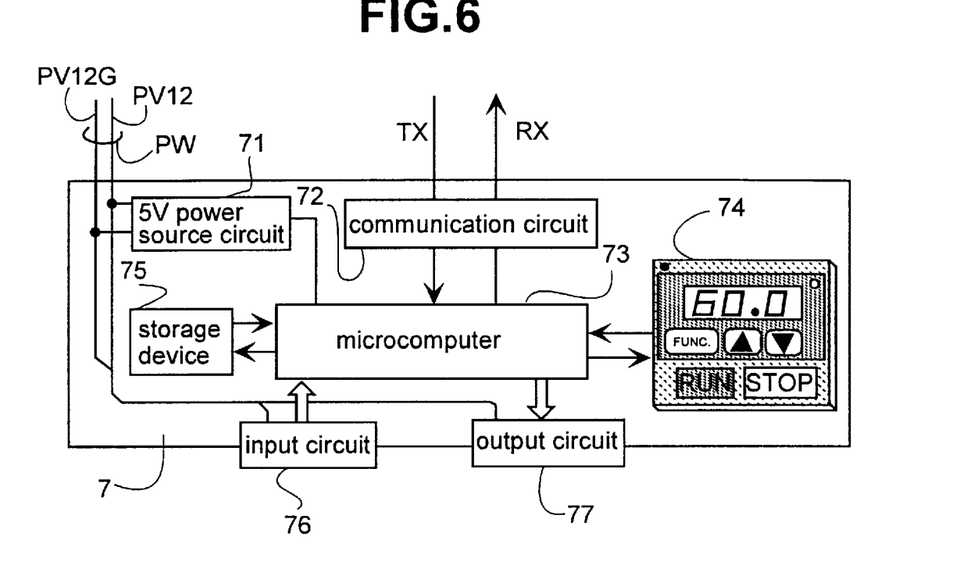
FIG. 6 is a block diagram showing a detailed configuration of a main portion (a configuration of an I/O unit) shown in FIG. 1.

FIG. 6 shows a configuration of the A type of I/O block unit 7. The A type of I/O block unit 7 includes 0.5V power source circuit 71 for being supplied with a 12V power source voltage (PV12–PV12G) to produce a 5V power source voltage, a communication circuit 72 for communicating with the side of the microcomputer 21 for a core, a microcomputer 73, an operator 74, a storage device 75, and an input circuit 76 and an output circuit 77 for inputting and outputting the signals to and from the outside of the inverter apparatus. Now, at least the input circuit 76 is different from the conventional input circuit 124 in that it is directly connected to the microcomputer 73 without through the isolation circuit 123.

In the operator 74, there are carried out the display of the data relating to the running frequency and the data relating to the current of the induction motor 5, the input of the various kinds of running data such as the frequency command, the acceleration time, the deceleration time and the inverter output voltage, and the input of the running stop command.

A user who is using the A type of I/O block unit 7 inputs the frequency command and the running stop command using the above-mentioned operator 74. Or, a user carries out, on the basis of the switching by the setting of the operator 74, the input of the frequency command and the running stop command through the above-mentioned input circuit 76 from the outside of the inverter apparatus.

In the microcomputer 73, mainly, both the input processing and the output processing are carried out. In the input processing, the input signals from the operator 74 and the input circuit 76 are fetched in to be processed into the serial data which is transmitted in turn in the form of a reception signal RX to the microcomputer 21 for a core through the communication circuit 72. For example, the frequency command which has been inputted through either the operator 74 or the input circuit 76 is inputted to the microcomputer 73 in which it is processed into the serial data to be transmitted to the microcomputer 21 for a core. Then, in the microcomputer 21 for a core, the inverter 13 is run so as to provide the desired frequency corresponding to the frequency command.

On the other hand, in the output processing of the microcomputer 73, serial transmission data TX which has been sent from the microcomputer 21 for a core through the communication circuit 72 is fetched in to be processed into the parallel data. Then, the parallel data thus obtained is either displayed on the operator 74 or outputted to the outside of the inverter apparatus through the output circuit 77. For example, the data relating to the current flowing through the induction motor 5 and the data relating to the inverter output frequency at that time point are processed into the serial data in the microcomputer 21 for a core to be fetched in the microcomputer 73 through both the communication circuit 28 and the communication circuit 72. Then, the serial data is processed into the parallel data and then is either displayed on the operator 74 or outputted to the outside of the inverter apparatus through the output circuit 77.

If as above-mentioned microcomputer 73, a microcomputer is employed in which the memory thereof includes a flash memory, so that the writing mode thereof can be selected. Similarly to the case as has already been described in the microcomputer 21 for a core, the software of the microcomputer 73 can be down loaded with the microcomputer 73 mounted on the associated substrate.

Communication Circuit

Figure 7:
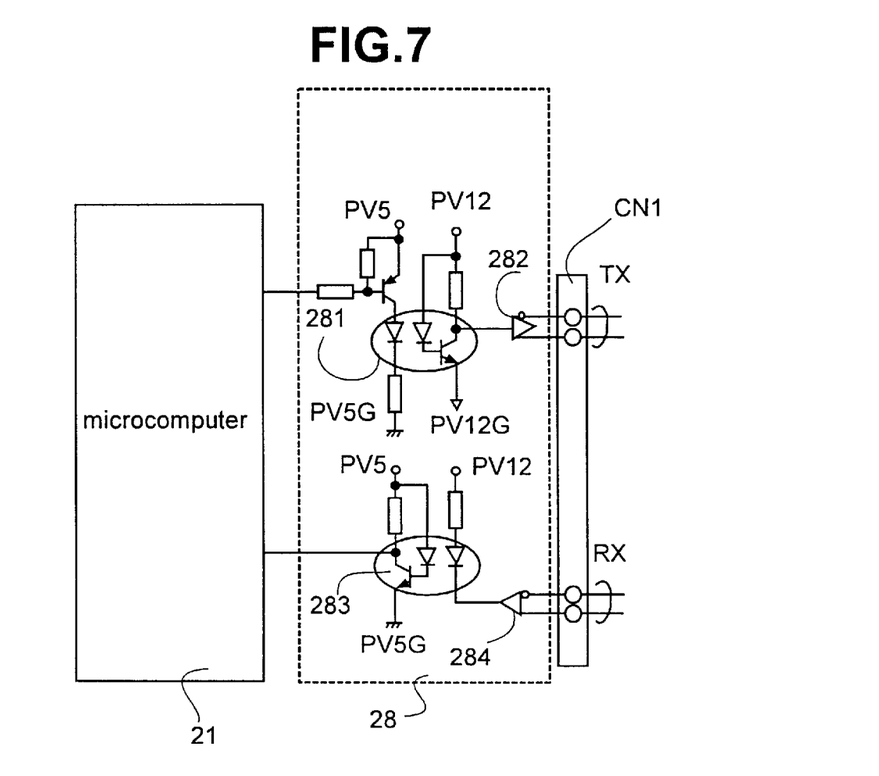
FIG. 7 is a circuit diagram, partly in block diagram, showing a detailed configuration of a main portion shown in FIG. 1.

FIG. 7 is a circuit diagram, partly in block diagram, showing a configuration of the communication circuit 28 which is mounted on the second substrate 2. The serial data TX which has been outputted from the microcomputer 21 for a core, more specifically, the transmission/reception processing unit (including the transmission/reception circuit) 21F is transmitted to the outside of the inverter basic unit COR through a photo-coupler 281 and a driver IC 282 which constitute the communication circuit 28, and a connector CN1. In addition, the serial reception data RX which has been outputted from the I/O block unit is, likewise, transmitted to the transmission/reception processing unit (including the transmission/reception circuit) 21F provided within the microcomputer 21 for a core through a photo-coupler 283 and a receiver IC 284 which constitute the communication circuit 28, and the connector CN1. That is, these serial transmission/reception signals are isolated between the I/O block unit side and the core control unit side through the two photo-couplers 281 and 283.

Another Embodiment of the Present Invention

Figure 8:
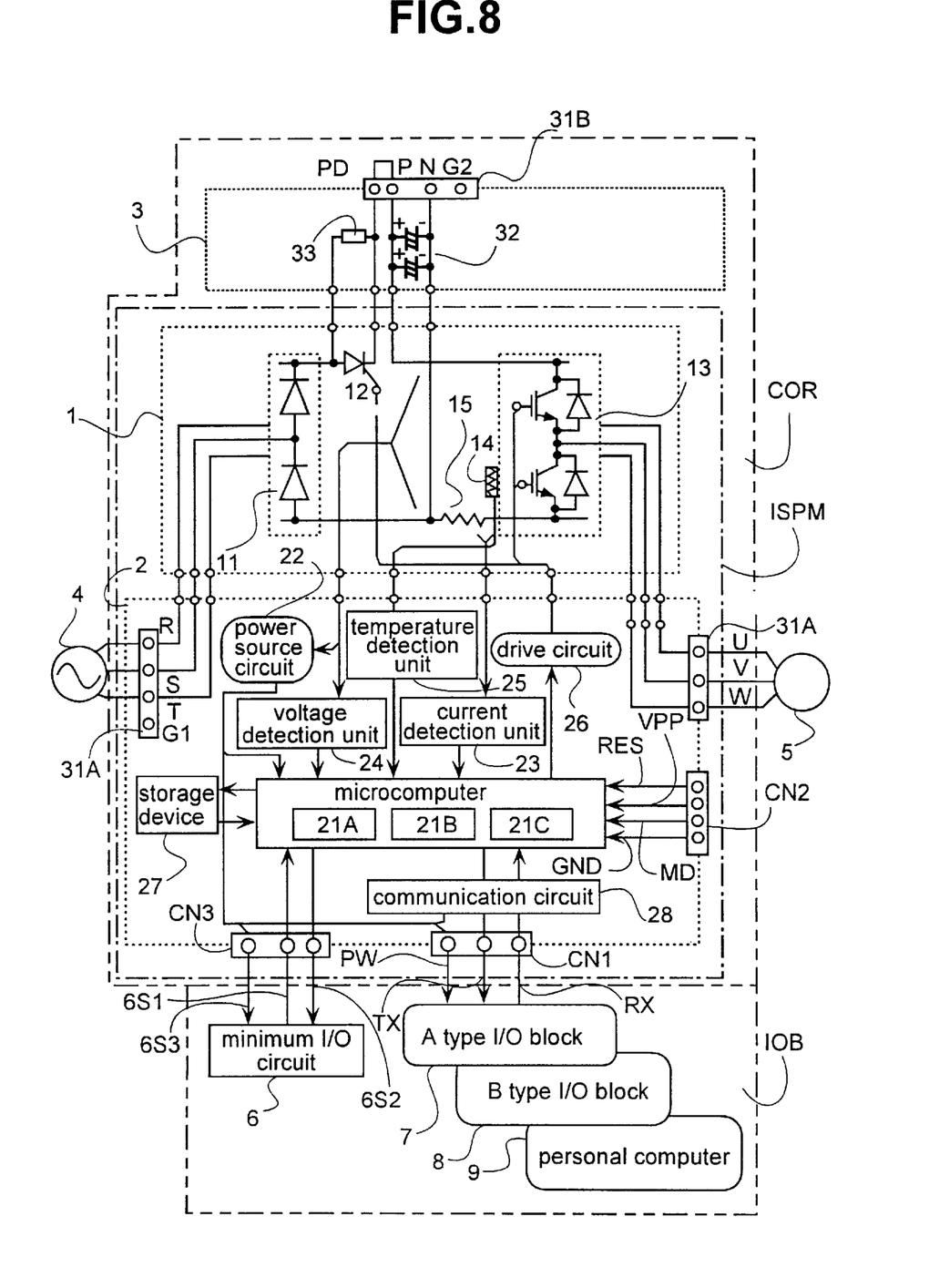
FIG. 8 is a block diagram, partly in circuit diagram, showing a configuration of an inverter apparatus according to another embodiment of the present invention.
Figure 9:
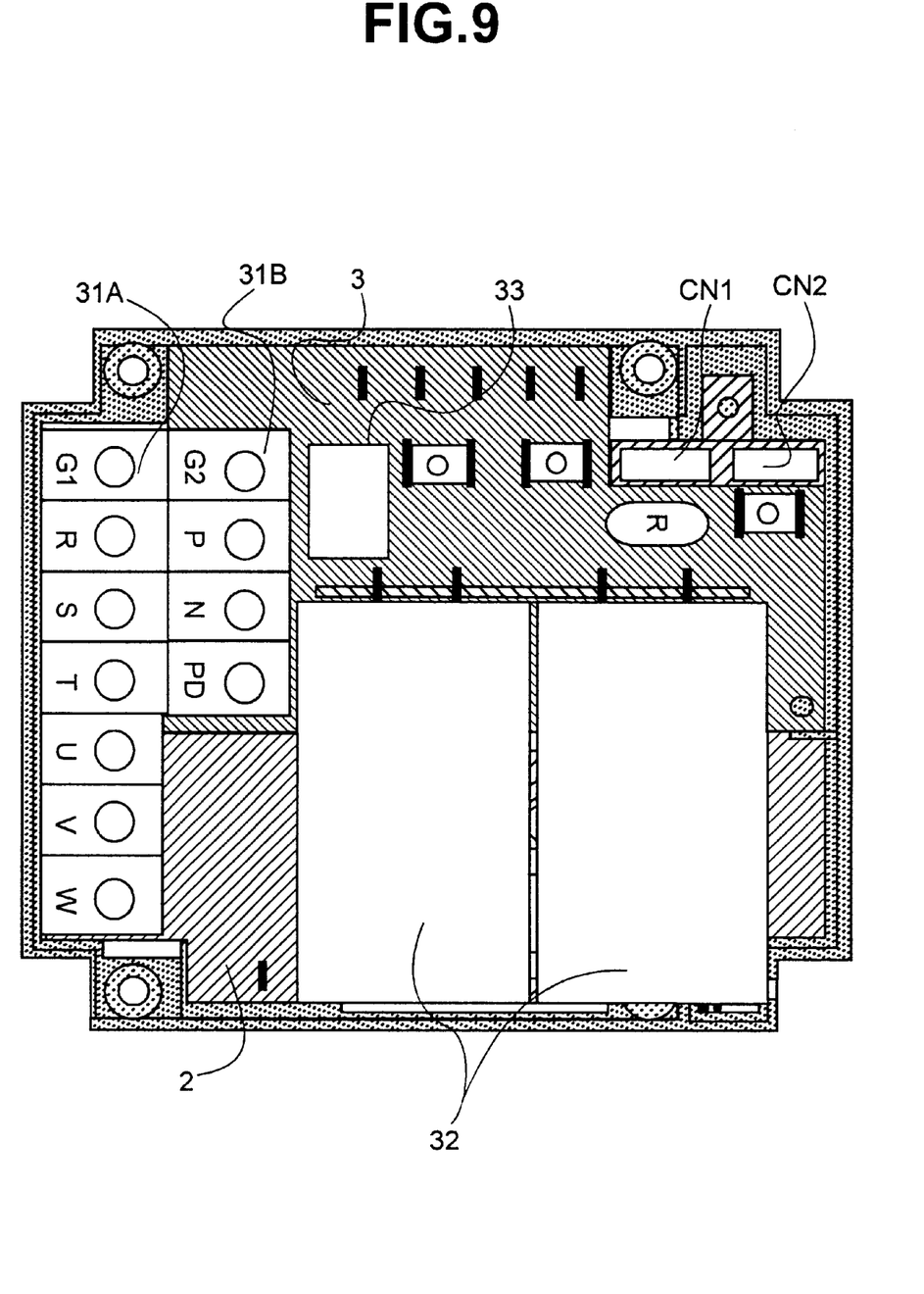
FIG. 9 is a plan view showing a structure of a main portion of the inverter apparatus shown in FIG. 8.
Figure 10:
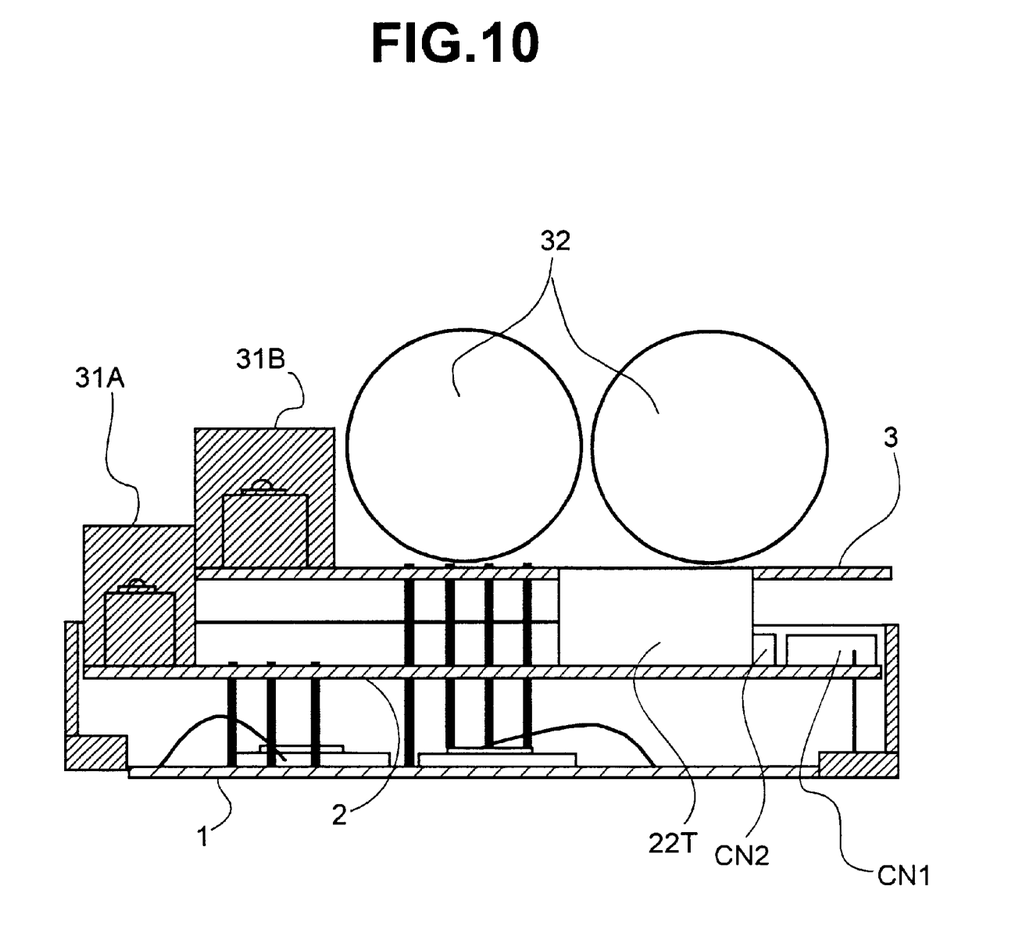
FIG. 10 is a transverse cross sectional view showing a structure of a main portion shown in FIG. 8.

Now, another embodiment of the present invention will hereinafter be described in detail with reference to FIGS. 8 to 10. A point of difference of the present embodiment from the above-mentioned embodiment is that the present embodiment is suitable for the inverter apparatus oriented for a relatively large capacity. In general, since if the capacity of the smooting capacitor 32 is increased and the size thereof is also increased as the capacity of the inverter apparatus is further increased, when mounting the smoothing capacitor having the increased capacity on the associated substrate, the space suitable therefor is required to be ensured. The present embodiment shown in FIGS. 8 to 10 is constructed by taking this point into consideration. Then, the description will hereinbelow be given mainly with respect to a point of difference of the present embodiment from the above-mentioned embodiment shown in FIGS. 1 to 7.

FIG. 8 is a block diagram, partly in circuit diagram, showing a basic configuration of the inverter apparatus according to another embodiment of the present invention.

Both the rush current suppressing resistor 33 and the smoothing capacitors 32 are mounted on the third substrate 3. In this example, the two smoothing capacitors 32 are provided in parallel with each other. On the other hand, a terminal stage 31B has the terminals PD, P and N, and the terminal G2 to which the earth cable is connected. Now, the power source connection terminals R, S and T, and the induction motor connection terminals U, V and W, as other terminals, and the other earth cable connection terminal G1 are all mounted on the second substrate 2 to ensure the required space in the area of the third substrate 3 so that the two smoothing capacitors 32 can be mounted on the third substrate 3 in terms of the space.

FIG. 9 shows a plan view of the structure of the upper surface of the inverter basic unit in another embodiment (shown in FIG. 8) of the present invention, and FIG. 10 shows a transverse cross sectional view of the inverter basic unit in another embodiment of the invention. In these figures, the illustration of both the gel layer and the resin layer are omitted for the sake of simplicity.

A terminal stage 31A is mounted on the second substrate 2, and the terminal state 31B is mounted on the third substrate 3.

As described above, according to the embodiments of the present invention, the inverter apparatus is constructed in such a way that with respect to the microcomputer processings of managing the overall conventional inverter controller, the management of the input/output interface and the management of the main circuit unit on the inverter side can be separated from each other. Therefore, it is possible to provide readily an inverter apparatus which is capable of fulfilling the consumer specifications by changing only the I/O block unit without changing the inverter basic unit.

In addition, since the construction is adopted such that the software of the microcomputer for carrying out concretely the management of the main circuit unit on the inverter side can be changed with the microcomputer mounted on the associated substrate, and hence with respect to the inverter basic unit as well, the specification and the performance thereof can be readily changed.

In addition, since the inverter basic unit is constructed integrally in the form of the power module, the reduction in the number of components, the improvements in reliability of the inverter apparatus and the miniaturization thereof can be readily realized.

Further, since as for signal transmission between the inverter basic unit and the I/O block unit, the serial communication is employed, the general personal computer can be connected to the inverter basic unit, and even if the hardware of the I/O block unit is not newly developed, by only the development of the software of the personal computer, the inverter controller can be readily realized.

Further, the inverter basic unit and the I/O block unit can be installed separately from each other, and hence the number of degrees of freedom of installation can be increased.

In addition, since the isolation is established, in the form of the serial transmission, between the inverter basic unit and the I/O block unit, the input circuit of the I/O block unit does not need to be isolated from any of the external devices of the inverter apparatus.

As set forth hereinabove, according to the present invention, it is possible to provide readily an inverter apparatus which is capable of fulfilling the customer specifications by only the change of the I/O block unit without changing the inverter basic unit.

In addition, since the software of the microcomputer can be changed with the microcomputer mounted on the associated substrate, with respect to the inverter basic units as well, the specification and the performance thereof can be readily changed.

Furthermore, since the inverter basic unit is constructed integrally in the form of the power module, the reduction in the number of components, the improvements in reliability of the inverter apparatus and the miniaturization thereof can be readily realized.

While the present invention has been particularly shown and described with reference to the preferred embodiments thereof, it will be understood that the various changes and modifications will occur to those skilled in the art without departing from the scope and true spirit of the invention. The scope of the invention is therefore to be determined solely by the appended claims.

What is claimed is:

1. An inverter apparatus including: a DC/AC converter having power semiconductor devices and at least one smoothing capacitor for smoothing a DC current; a controller for controlling said DC/AC converter; and an input/output interface unit having signal connection terminals through which an input/output signal is transmitted to said controller, said inverter apparatus further comprising:
   an inverter basic unit which serves as a power module comprised of a part of said controller for controlling the management inherent of said DC/AC converter with management contents independent from a customer's request, and a part of said DC/AC converter;
   at least one I/O block unit which controls the management of said input/output interface unit with management contents dependent upon a customer's request, said I/O block unit being constructed as a separate block unit from said power module; and wherein said power module is capable of being connected to said I/O block unit having different performances and functions due to the customer's request, and the performance and the functions of said inverter apparatus are changed in accordance with said I/O block unit connected to said power module.

2. An inverter apparatus according to claim 1, wherein said inverter basic unit includes a first substrate on which a plurality of power semiconductor devices are mounted, a second substrate on which a communication circuit between a microcomputer and said I/O block unit is mounted, and a third substrate on which said at least one smoothing capacitor is mounted, and out of said first, second and third substrates, said first substrate and said second substrate are constructed in the form of said power module which is mounted on a single package.

3. An inverter apparatus according to claim 2, wherein said second substrate is provided with a connection connector through which a software of said microcomputer is loaded from the outside of said power module.

4. An inverter apparatus according to claim 1, wherein frequency command data is transmitted from said I/O block unit to said power module for controlling the frequency of an induction motor, and current data is transmitted from said power module to said I/O block unit for a visual indication of current information.

5. An inverter apparatus according to claim 4, wherein signal transmission between said power module and said I/O block unit is discrete serial communication between said power module and said I/O block unit.

6. An inverter apparatus including: a DC/AC converter having power semiconductor devices and at least one smoothing capacitor for smoothing a DC current; a controller for controlling said DC/AC converter; and an input/output interface unit having signal connection terminals through which an input/output signal is transmitted to said controller, wherein said inverter apparatus is constructed as a power module in which said power semiconductor devices composing said DC/AC converter and said controller for controlling the management inherent of said DC/AC converter are mounted on a single package, and said power module is provided with an end connection through which said controller and at least one I/O block unit separable from said power module for controlling the management of said input/output interface unit are electrically connected for bidirectional communication.

7. An inverter apparatus including electric power converting means having switching devices for converting a DC electric power to an AC electric power, and control means for controlling said electric power converting means, wherein at least said electric power converting means and said control means for controlling the management inherent of said DC/AC converter are constructed in the form of a power module which is mounted on a single package, and said power module is provided with connection means through which an input/output signal is transmitted from at least one I/O block unit disposed separately from said power module for controlling general management of said DC/AC converter except the management inherent of said DC/AC converter.

8. An inverter apparatus according to claim 7, wherein said control means is provided with a microcomputer comprising a memory which stores a program for controlling the management inherent of said DC/AC converter, newly updated program data of said microcomputer is loaded into said memory through said connection means.

9. An inverter apparatus according to claim 8, wherein said memory is a flash memory.

10. An inverter apparatus for regulating a speed of an induction motor driven by an AC power source, said inverter apparatus comprising:

a basic inverter unit supporting at least an AC/DC converter which converts an AC voltage from said AC power source into a DC voltage, an DC/AC converter which converts the DC voltage into three-phase AC voltages to control operations of said induction motor, a controller which senses the DC voltage from said AC/DC converter and controls operations of said DC/AC converter for regulating the speed of said induction motor in accordance with control signals received via an input/output (I/O) interface; and at least one input/output (I/O) control unit operatively connected to said inverter basic unit via said input/output (I/O) interface, which controls said input/output (I/O) interface for management of said controller in accordance with a user's requested specification, said input/output (I/O) control unit being separable from said inverter basic unit for changing the specification and performance of said inverter basic unit.

11. An inverter apparatus according to claim 10, wherein said inverter basic unit is integrated as a semiconductor device comprising:

a first substrate on which at least said AC/DC converter is mounted to convert the AC voltage into the DC voltage, and said DC/AC converter is mounted to convert the DC voltage into three-phase AC voltages;

a second substrate arranged in parallel to said first substrate on which at least said controller is mounted to regulate the speed of said induction motor; and a third substrate arranged in parallel to said second substrate on which a rush current suppressing resistor is mounted to suppress a rush current from said AC/DC converter, and a smoothing capacitor is mounted in parallel to said rush current suppressing resistor to smooth the current from said AC/DC converter.

12. An inverter apparatus according to claim 11, wherein said controller comprises:

a storage device;

a power source sensor which senses the DC voltage converted from said AC/DC converter;

a communication circuit which provides an interface with said input/output (I/O) interface; and a microcomputer having a program which regulates the speed of said induction motor in accordance with control signals from said input/output (I/O) interface through said communication circuit, said program being updated via software download from said input/output (I/O) control unit for changing the specification and performance of said inverter basic unit.

13. An inverter apparatus according to claim 12, wherein said microcomputer includes a flash memory which stores said program for regulating the speed of said induction motor.

14. An inverter apparatus according to claim 12, wherein said communication circuit comprises a serially connected photo-coupler and a driver IC which transmits data from said microcomputer to said input/output (I/O) control unit via said input/output (I/O) interface, and a serially connected receiver IC and photo-coupler which receives data from said input/output (I/O) control unit to said microcomputer via said input/output (I/O) interface.

15. An inverter apparatus according to claim 12, wherein said power source sensor comprises:

a power source circuit which provides various types of DC voltages from said AC/DC converter;

a current detection circuit which detects the DC current from said AC/DC converter;

a voltage detection circuit which detects the DC voltage from said AC/DC converter;

a temperature detection circuit which detects a temperature of said AC/DC converter and said DC/AC converter; and a drive circuit which supplies a drive signal to said DC/AC converter to convert the DC voltage into the three-phase AC voltages.

16. An inverter apparatus according to claim 11, wherein said input/output (I/O) control unit corresponds to a personal computer connected to said inverter basic unit via said input/output (I/O) interface.

17. An inverter apparatus according to claim 11, wherein said AC/DC converter and said DC/AC converter are configured by three-phase bridge connection of switching diodes mounted on said first substrate and insulated by gel.

18. An inverter apparatus according to claim 11, wherein said input/output (I/O) control unit corresponds to a personal computer connected to said inverter basic unit via said input/output (I/O) interface.

19. An inverter apparatus according to claim 11, wherein said first substrate further supports a thyristor disposed at one output terminal of said AC/DC converter to short circuit the rush current suppressing resistor, a resistor disposed at another output terminal of said AC/DC converter to detect the DC current, and a thermistor disposed to sense the temperature of said AC/DC converter and said DC/AC converter.

20. An inverter apparatus according to claim 19, wherein said third substrate further supports a second smoothing capacitor disposed in parallel to the first smoothing capacitor to smooth the current from said AC/DC converter.

* * * * *